(12) United States Patent
El Hallak et al.

(10) Patent No.: US 9,245,551 B2
(45) Date of Patent: Jan. 26, 2016

(54) NITROGEN-VACANCY NANOCRYSTAL MAGNETIC SOURCE SENSOR

(71) Applicant: Seagate Technology LLC, Cupertino, CA (US)

(72) Inventors: Fadi El Hallak, Londonderry (GB); Marcus B. Mooney, Quigley's Point (IE)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/661,558

(22) Filed: Mar. 18, 2015

(65) Prior Publication Data

US 2015/0269957 A1 Sep. 24, 2015

Related U.S. Application Data

(60) Provisional application No. 61/954,903, filed on Mar. 18, 2014.

(51) Int. Cl.

| G11B 19/00 | (2006.01) |
|---|---|
| G11B 5/455 | (2006.01) |
| G11B 27/36 | (2006.01) |
| G11B 13/04 | (2006.01) |
| G11B 5/127 | (2006.01) |
| G01R 33/02 | (2006.01) |

(52) U.S. Cl.
CPC ............... *G11B 5/455* (2013.01); *G01R 33/02* (2013.01); *G11B 5/127* (2013.01); *G11B 13/045* (2013.01); *G11B 19/00* (2013.01); *G11B 27/36* (2013.01)

(58) Field of Classification Search
CPC ........................................................ G11B 19/00
USPC ............................................................. 360/88
See application file for complete search history.

(56) References Cited

U.S. PATENT DOCUMENTS

| 7,449,361 B2 | 11/2008 | Baskaran et al. |
|---|---|---|
| 7,875,934 B2 | 1/2011 | Baskaran et al. |
| 8,193,808 B2 | 6/2012 | Fu et al. |

(Continued)

FOREIGN PATENT DOCUMENTS

| WO | 2012/152685 A1 | 11/2012 |
|---|---|---|
| WO | 2012/174098 A2 | 12/2012 |

(Continued)

OTHER PUBLICATIONS

Eric Betzig, George H. Patterson, Rachid Sougrat, O. Wolf Lindwasser, Scott Olenych, Juan S. Bonifacino, Michael W. Davidson, Jennifer Lippincott-Schwartz and Harald F. Hess, "Imaging Intracellular Fluorescent Proteins at Nanometer Resolution," Science, Sep. 15, 2006, pp. 1642-1645, vol. 313, www.sciencemag.org.

(Continued)

Primary Examiner — Allen T Cao
(74) Attorney, Agent, or Firm — Hall Estill Attorneys at Law

(57) ABSTRACT

A sensor may be configured with a nanocrystal that has a nitrogen-vacancy. The nanocrystal can be positioned proximal a magnetic source, mount, and articulable stage. Various embodiments configure the articulable stage configured to align the nanocrystal and the magnetic source along a common axis to sense magnetic fields about the magnetic source with a sub-nanometer resolution.

20 Claims, 4 Drawing Sheets

(56) References Cited

U.S. PATENT DOCUMENTS

| | | | |
|---|---|---|---|
| 8,547,090 B2 * | 10/2013 | Lukin | G01R 33/032 324/244.1 |
| 8,587,382 B2 | 11/2013 | Gan | |
| 2007/0066034 A1 | 3/2007 | Baskaran et al. | |
| 2012/0019242 A1 | 1/2012 | Hollenberg et al. | |
| 2012/0227513 A1 * | 9/2012 | Sato | 73/862.69 |
| 2015/0001422 A1 | 1/2015 | Englund et al. | |

FOREIGN PATENT DOCUMENTS

| | | |
|---|---|---|
| WO | 2013/066446 A1 | 5/2013 |
| WO | 2013/188732 A1 | 12/2013 |
| WO | 2014/011286 A2 | 1/2014 |

OTHER PUBLICATIONS

Gopalakrishnan Balasubramanian, I. Y. Chan, Roman Kolesov, Mohannad Al-Hmoud, Julia Tisler, Chang Shin, Changdong Kim, Aleksander Wojcik, Philip R. Hemmer, Anke Krueger, Tobias Hanke, Alfred Leitenstorfer, Rudolf Bratschitsch, Fedor Jelezko and Jorg Wrachtrup, "Nanoscale imaging magnetometry with diamond spins under ambient conditions," Nature Letters, Oct. 2008, pp. 648-652, vol. 45512, Macmillan Publishers Limited.

* cited by examiner

NITROGEN-VACANCY NANOCRYSTAL MAGNETIC SOURCE SENSOR

RELATED APPLICATION

The present application makes a claim of domestic priority to U.S. Provisional Patent Application No. 61/954,903 filed Mar. 18, 2014, the contents of which are hereby incorporated by reference.

SUMMARY

A sensor, in accordance with some embodiments, configure a sensor with at least one nanocrystal having a nitrogen-vacancy. The nanocrystal is positioned proximal a data writer and an articulable stage that aligns the nanocrystal and the data writer along a common axis to sense magnetic fields about the data writer with a sub-nanometer resolution.

DETAILED DESCRIPTION

Consumer and industry demand for greater data storage capacity and data access speed in reduced form factor computing devices has emphasized the stability and efficiency of various data storage components, such as and writers. Increased data bit areal density in rotating data storage devices has elevated data bit capacity, but has stressed the spatial resolution and operating capacity of data accessing components. For example, data writers are configured to produce greater magnetic field strengths meant to be translated to nanometer scale data bit areas of an adjacent data storage medium. Although computer modeling can simulate magnetic operating capabilities of a data writer, industry has a continued goal of attaining an experimental means for sensing and mapping the sub-nanometer scale magnetic fields generated by a data writer.

To that end, various embodiments configure a nanocrystal with a nitrogen-vacancy that is positioned proximal a rigid or flexible mount and a data writer with the mount and nanocrystal tuned to sense magnetic fields about the data writer with a sub-nanometer resolution. The ability to use high magnetic field gradients produced by data writers to provide sub-nanometer magnetic mapping resolution allows for precise testing of new and existing data writer components. Such precise magnetic mapping can be done regardless of the physical size of the data writer as the amount of magnetic field gradient serves to allow sub-nanometer magnetic field mapping about the data writer. A sub-nanometer magnetic field map may further allow design and process defects to be efficiently detected. For instance, a nanocrystal sensor can be utilized to verify computer models, fabrication processing, and the magnetic extent of a data writer as well as predict the risk of the data writer experiencing unwanted magnetic conditions, such as adjacent track interference (ATI) and side track erasure (STE).

Figure 1:
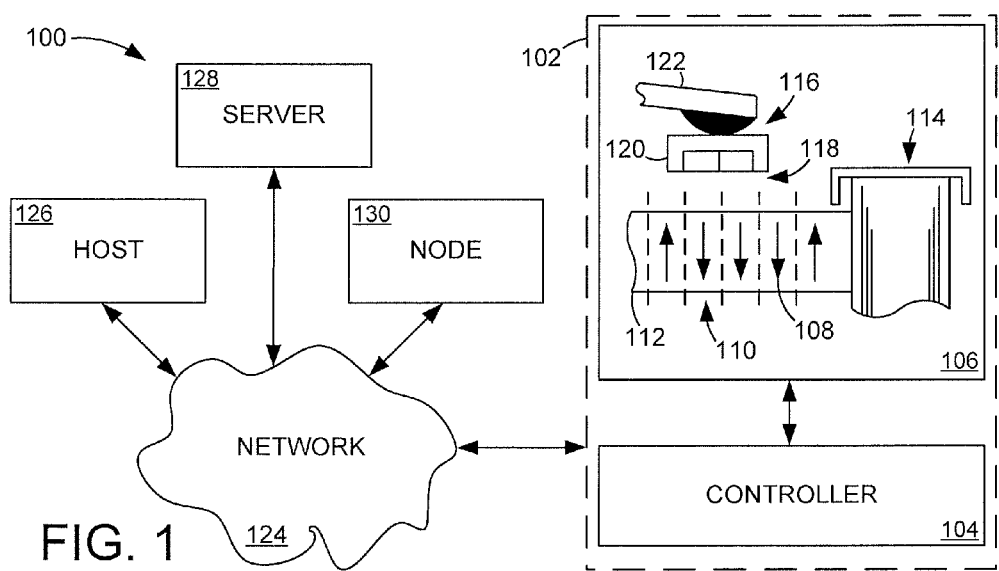
FIG. 1 is a line representation of an example portion of a data storage system configured and operated in accordance with some embodiments.

While a nanocrystal sensor can be utilized to sense and map magnetic fields for a variety of magnetic components, such as assorted micro/nano magnetic structures, various embodiments test magnetic components that are employed in data storage systems. FIG. 1 generally displays an example data storage system 100 that is arranged in accordance with some embodiments. Although not required or limiting, the data storage system 100 may have any number of data storage devices 102 that comprise one or more local controllers 104 and a data transducing system 106, such as a part of a cloud computing environment. The portion of a single data transducing system 106 shown in FIG. 1 illustrates how a plurality of magnetic data bits 108 can be perpendicularly stored in and read from data tracks 110 on a data medium 112 that is controlled by a centrally positioned spindle motor 114.

An actuating assembly 116 can be configured to float a predetermined distance above the data bits 108 and data medium 112 on an air bearing 118 so that at least one transducing head 120 is suspended over selected data bits 108 and tracks 110. In this way, the local controller 104 can dictate data access to and from the data medium 112 across an air bearing surface (ABS) by spinning the spindle motor 114 and articulating the actuating arm 122. It should be noted that control of the data transducing system 106 is not limited to the local controller 104 as various remote computing components can concurrently and individually utilize the transducing system 106 across one or more networks 124 via appropriate communications protocol.

The ability to connect any type, function, and number of computing components to the data storage device 102 remotely allows for optimized utilization of the data transducing system 106. For example, the local controller 104 can operate in conjunction with a host 126, server 128, and node 130 to employ any number of processors and memory arrays to access data to and from the transducing system 106. Despite the ability to remotely and locally control the transducing system 106, minimization of the physical size of the transducing system 106 and increases in the areal density of the data bits 108 has stressed the magnetic extent and precision of data access components, like data and writers.

Figure 2A:
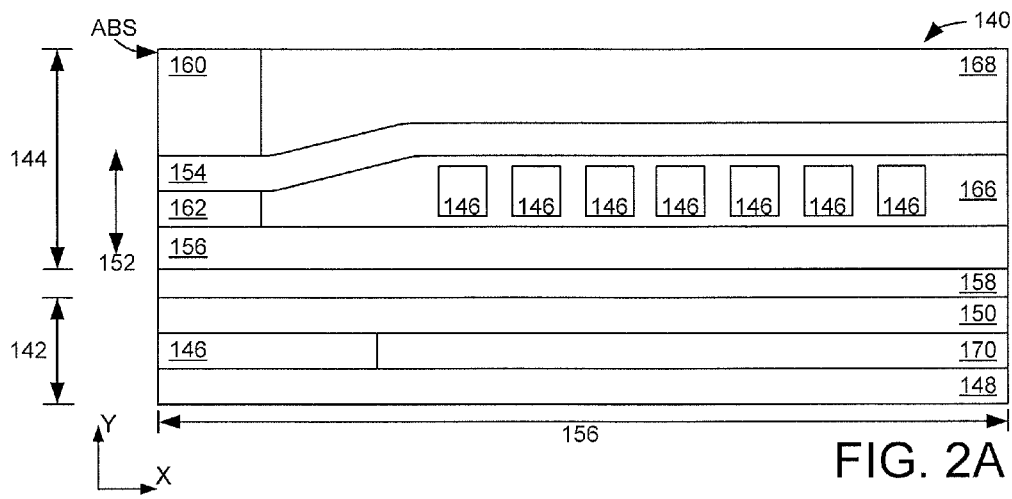
FIGS. 2A and 2B respectively show cross-sectional and ABS view line representations of portions of an example transducing head capable of being utilized in the data storage system of FIG. 1.
Figure 2B:
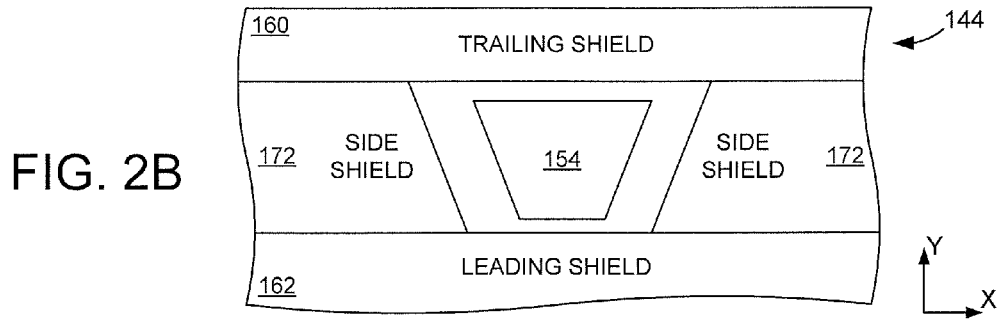

FIGS. 2A and 2B respectively display cross-section and ABS view block representations of portions of an example transducing head 140 that is capable of being used in the data storage system of FIG. 1. The transducing head 140 can have one or more magnetic elements, such as the magnetic reader 142 and writer 144, which can operate individually, and concurrently, to write data to or retrieve data from an adjacent storage medium, such as medium 108 of FIG. 1. Each magnetic element 142 and 144 is constructed of a variety of shields and a transducing element that operates on the data medium with a predetermined magnetic extent, such as a square nanometer that may or may not correspond with the physical size of a data bit.

As shown, the magnetic reading element 142 has a magnetoresistive structure 146 disposed between leading and trailing shields 148 and 150, as defined by the direction of travel 152 of the transducing head 140. The writing element 144 is formed with a write (main) pole 154 and a return pole 156 that create a writing circuit to impart a desired magnetic orientation to the adjacent storage medium. The return pole 156 is separated from the read element 142 by a gap layer 158 of non-magnetic material while the write pole 154 is disposed between a trailing shield 160 and an insulating material 162 that maintains separation of the writing poles 154 and 156.

The writing element 144 further includes a coil 164 that can be one or many individual wires capable of imparting a magnetic flux on the write pole 154 to travel through the write circuit that concludes at the return pole 156. Additional insulating layers 166, 168, and 170 respectively contact the coil 164, write pole 154, and MR structure 146 to prevent leakage of magnetic flux distal the ABS. The shields of the transducing head 140 can be characterized by their position with respect to the timing of encountering external bits, such as bits 108 of FIG. 1. In other words, the shields that encounter the external bits before the transducing elements 142 and 144 are "leading" shields while shields that see the bits after the transducing elements are "trailing" shields.

FIG. 2B shows an ABS view of a portion of the data writer 144 that is configured in accordance with assorted embodiments. The data writer 144 illustrates how the main pole 154 can have a trapezoidal shape with continuously tapered sidewalls with respect to the Y axis and a narrower leading edge than trailing edge. The main pole 154 can be disposed between and separated from the trailing 160, leading 162, and side 172 shields by a continuous or multi-layer insulating material 174. The main pole 154 may be tuned, as shown, with a rhomboid shape, such as a trapezoid, that can have similar or dissimilar sidewall angles with the respective side shields 172 along the Y axis. Tuning the main pole 154 and shields 160, 162, and 172 can provide a balance between magnetic shielding of stray fields and inadvertent shunting that can degrade the performance of the data writer 144.

For example, one or more magnetic shields can be configured define a magnetic extent of the main pole 154 outside of which stray magnetic fields are absorbed and withstood and inside which magnetic flux from the main pole 154 is focused to an adjacent data storage medium instead of escaping the data writer 144 on the ABS. As the areal bit density of data increases, the physical size of data writer 144 is decreased and magnetic shields are tuned in an effort to define a magnetic extent that consistently has a nanometer resolution to allow for the programming of a individual data bits. That is, the physical size of the writer pole 154 can operate in combination with magnetic shields to maintain magnetic fields in a predetermined physical extent that is approximately the size of a single data bit.

Figure 3:
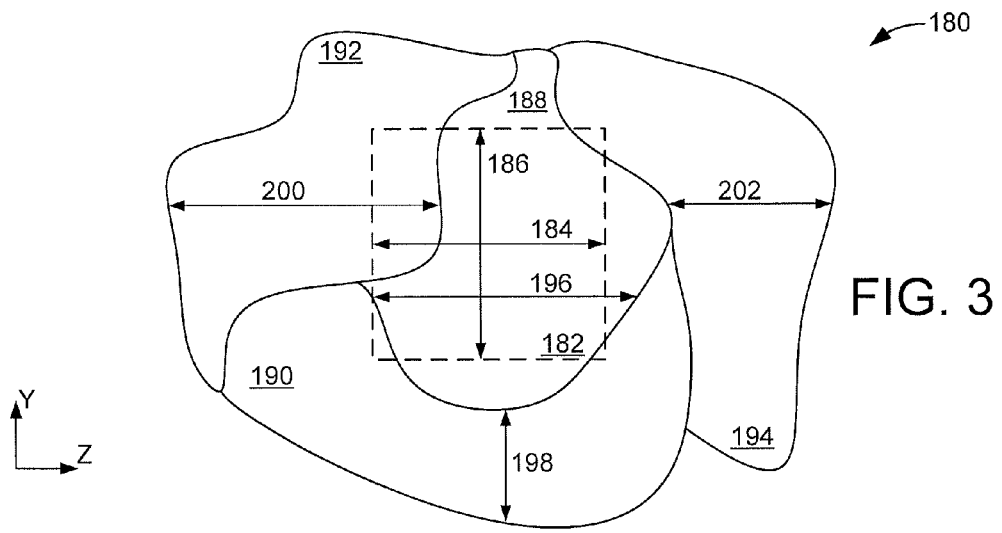
FIG. 3 displays an ABS view line representation of an example data writer and magnetic fields about the data writer in accordance with various embodiments.

FIG. 3 illustrates an ABS view of an example portion of a data writer 180 having a magnetic extent that is greater than a nanometer. A rectangular shaped write pole 182 portion of the data writer 180 is shown, but is in no way required or limiting as the pole 182 can be shaped and sized differently as well as accompanied by multiple pole tips on the ABS. With magnetic shields, such as shields shown in FIGS. 2A and 2B, optimized to define a writer magnetic extent that allows individual data bit resolution, variations in write pole 182 design and fabrication processing can induce structural and operational variability that can jeopardize the efficiency and reliability of the data writer 180.

Decreasing physical dimensions for the data writer 180 can result in the write pole 182 having a width 184 and length 186 that are less than a nanometer, such as an angstrom. In other words, the write pole 182 can be configured with a width 184, length 186, and ABS surface area that are respectively less than a nanometer, such as less than 10 angstroms. Such small physical dimensions are difficult to experimentally test. Thus, micromagnetic computer modeling has been utilized to predict the magnetic characteristics and response to various operational conditions, such as being activated for the programming of one or more data bits on an adjacent data storage medium.

However, it has been found that computer modeling of magnetic characteristics is imprecise at sub-nanometer scale write pole 182 dimensions. Furthermore, such computer modeling cannot accurately account for fabrication processing variability that can affect the magnetic characteristics of the write pole 182. Although computer models may predict magnetic fields and gradients in, on, and around the write pole 182, the accuracy of the predicted magnetic fields may not be precise enough to detect correctable and non-correctable defects in the write pole 182 and adjacent magnetic shields.

As illustrated in FIG. 3, first 188, second 190, third 192, and fourth 194 different magnetic fields can be detected or modeled in spatial relation to the write pole 182 in activated and deactivated states. However, the accuracy of the modelled magnetic fields is not small enough to accurately detect structural and operational write pole 182 defects. That is, a write pole 182 defect may be present if magnetic gradients of predetermined strengths have an ABS area that is less than the ABS area of the write pole 182. In other words, in the event the physical size 196, 198, 200, and 202 of the respective magnetic fields 188, 190, 192, and 194 is larger than the physical area of the write pole 182 on the ABS, structural and operational write pole 182 errors can go undetected. Thus, an experimental means of mapping magnetic fields about a write pole 182 with a sub-nanometer scale resolution can increase the efficiency of write pole 182 testing and the accuracy of defect identification.

Figure 4:
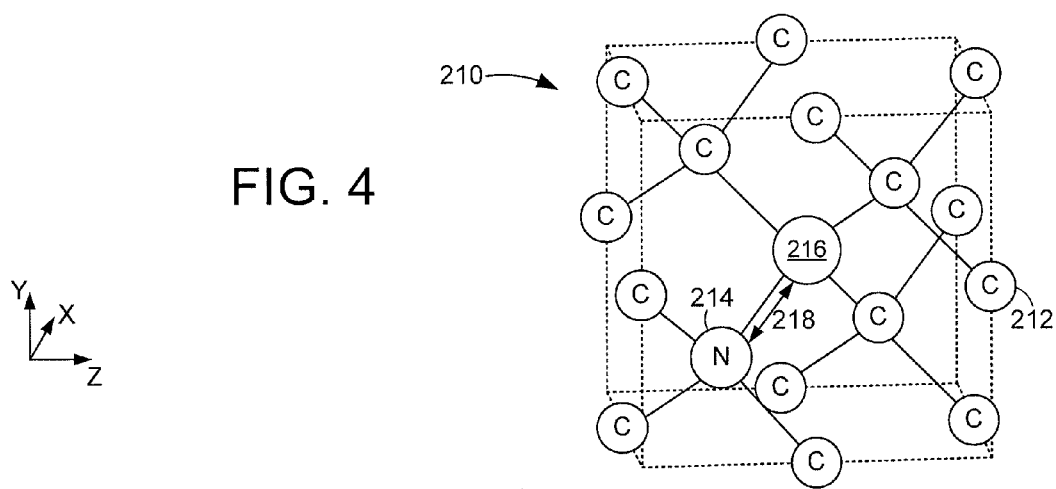
FIG. 4 shows a crystal structure of an example nanocrystal configured in accordance with some embodiments.

The utilization of a nanocrystal having a nitrogen-vacancy can allow for sub-nanometer scale experimental resolution that can optimize design and fabrication of data bit accessing components, like data writers. FIG. 4 provides a block representation of an example nanocrystal 210 having a nitrogen-vacancy in accordance with some embodiments. The nanocrystal 210 may be constructed of any variety of materials that utilize magnetic field gradients to sense magnetic fields with a sub-nanometer scale resolution when excited but various embodiments utilize the nitrogen-vacancy in diamond shown in FIG. 4.

The nanocrystal 210 has a number of carbon atoms 212 having a predetermined lattice structure and bound to at least one nitrogen atom 214. The inclusion of the nitrogen atom 214 can disrupt the diamond lattice structure and produce a vacancy 216, which will herein be understood as a nitrogen-vacancy due to the influence of the nitrogen atom 214. The nitrogen vacancy 216 can have a vacancy length 218 that can be uniform or dissimilar dimensions in different nanocrystal structures. The nitrogen-vacancy 216 can be sensitive to external magnetic fields and, as such, function as an atomic scale sensor that can be utilized as a scanning probe magnetometer to map magnetic fields and field gradients with nanometer scale resolution.

Figure 5:
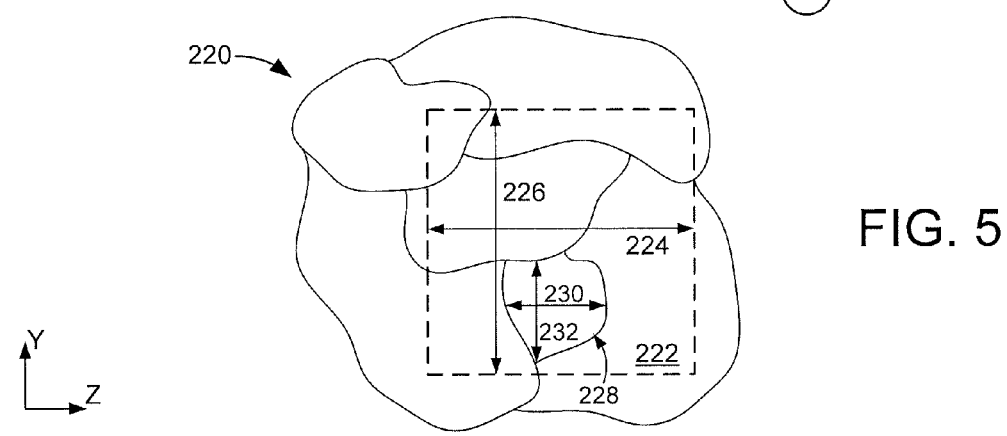
FIG. 5 is an ABS view line representation of an example data writer and magnetic fields about the data writer in accordance with various embodiments.

It is contemplated that the nitrogen-vacancy 216 has a ground spin state of S=1, which is sensitive to an external magnetic field. Such magnetic sensitivity can be combined with optical (fluorescence) properties to enable sub-nanometer magnetic field resolution at ambient conditions. FIG. 5 is an ABS view block representation of a portion of an example data writer 220 configured with a write pole 222 having sub-nanometer scale physical dimensions. As shown and in comparison with the magnetic fields of FIG. 3, use of at least one nanocrystal with one or more nitrogen-vacancies can sense and map magnetic fields and field gradients that are smaller than the length 224, width 226, and area of the write pole 222.

Specifically, a nitrogen-vacancy nanocrystal can sense a magnetic field 228 that has a width 230, length 232, and area on the ABS that are each smaller than the corresponding structure of the write pole 222. That is, a sub-nanometer scale magnetic resolution provided by the nanocrystal having at least one nitrogen-vacancy can sense magnetic fields and field gradients that have a smaller physical size on the ABS than the write pole 222. With the ability to sense and map magnetic fields that are smaller and larger than the physical dimensions of the write pole 222, the experimental test tolerance is made more precise and thusly increases the ability to detect structural and operational defects in the write pole 222 and overarching data writer 220.

Figure 6:
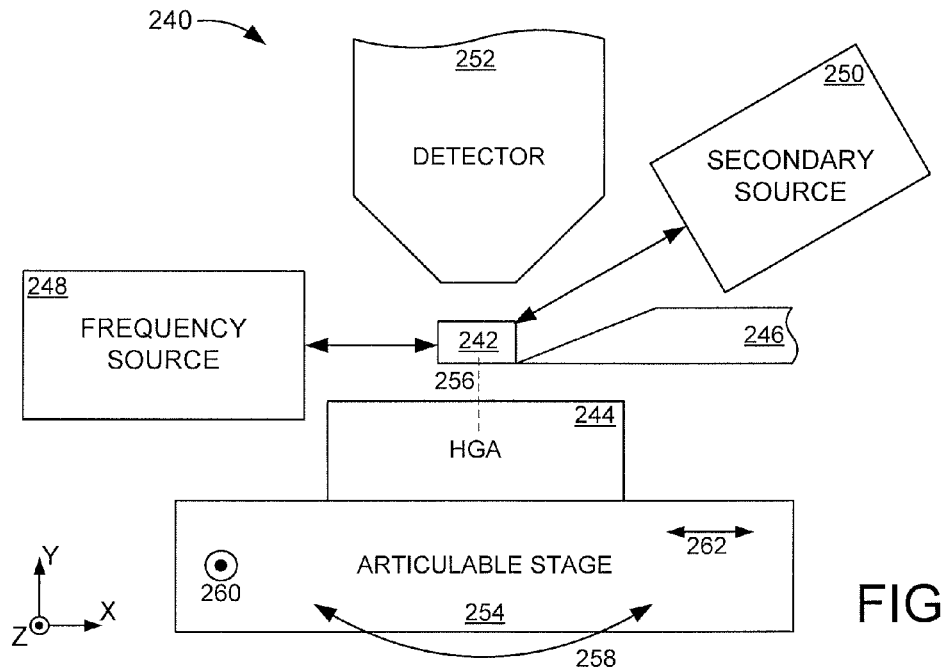
FIG. 6 provides a line representation of an example magnetic field sensor system constructed and operated in accordance with some embodiments.

FIG. 6 displays a block representation of portions of an example nanocrystal magnetic sensor system 240 configured in accordance with some embodiments. The magnetic sensor system 240 is a solid-state system that enables detection of electronic spin states at ambient conditions, such as room temperature, humidity, and barometric pressure. The magnetic sensor is not limited to the various aspects shown in FIG. 6, but can contain a nanocrystal 242 that has at least one nitrogen-vacancy. The nanocrystal 242 is constructed of diamond, in various embodiments, and configured with a plurality of separated nitrogen-vacancies to allow for magnetic field and field gradient mapping for at least a data writer portion of a head gimbal assembly (HGA) 244.

The nanocrystal 242 can be attached to a mount 246 that is maintained at a predetermined elevation separated from the HGA 244. Although a variety of materials and configurations can be used to suspend the nanocrystal 242, the mount may be configured to be capable of movement, such as via a piezoelectric actuator, which can be activated to articulate the nanocrystal 242 to a variety of different positions along the X-Z and Y-Z planes relative to the HGA 244. Primary 248 and secondary 250 frequency sources can individually and collectively be activated to excite some or all of the nanocrystal 242 to influence the behavior of at least one nitrogen-vacancy.

The mount 246, primary frequency source 248, and secondary frequency source 250 can each be tuned to apply external stimuli to the nanocrystal 242 so that the electrical state of at least one nitrogen-vacancy is altered. It is contemplated that one or more detectors 252 can be incorporated into the sensor system 240 to receive energy dispelled by the excitation of the nanocrystal 242. Such energy can be logged and processed, locally or remotely, into a map of magnetic fields and field gradients that are present about the HGA 244. For example, an optical detector can be used to collect light emitted from the nanocrystal 242 that can be processed to identify multiple different, concurrent magnetic fields being present about the HGA.

Despite the primary 248 and secondary 250 frequency sources being shown accessing the nanocrystal 242 from different planes, such configuration is not limiting as the sources 248 and 250 can be positioned anywhere in the sensor system 240 and access the nanocrystal 242 from an unlimited variety of similar or dissimilar angles with respect to the Y axis. The primary frequency source 248 may be a high frequency emitter, such as a radio frequency transmitter, that operates in conjunction with the mount 246 to provide sub-nanometer scale resolution for mapping magnetic fields about the HGA 244. Various embodiments can utilize a pattern of different frequencies from the primary frequency source 248 and different incident light waves from the secondary frequency source 250 to incite varying nitrogen-vacancy reactions that can be individually and collectively used to map magnetic fields over time.

The ability to map static and dynamic magnetic fields of the HGA 244 can be diminished by testing and mapping incorrect portions of the HGA 244. That is, misalignment of the nanocrystal 242, detector 252, and data writing portions of the HGA 244 can produce magnetic field maps that do not represent the data writing capabilities of the HGA 244. Accordingly, the HGA 244 can be mounted on an articulable stage 254 that can translate the HGA 244 to align the detector 252, nanocrystal 242, and HGA 244 along a common axis 256, parallel to the Y axis. Alignment along the common axis 256 may correspond with the center of the nanocrystal 242, one or more nitrogen-vacancies, and a write pole portion of the HGA 244 to optimize sensor system 240 efficiency and performance.

In some embodiments, the articulable stage has at least one piezoelectric actuator that can rotate 258 the stage 254 as well as shift the stage 254 along perpendicular first 260 and second 262 directions. It is contemplated that the sensor system 240 may be maintained in a predetermined magnetic field, which may provide magnetic field gradients in and about the HGA 244 that provides nanometer scale magnetic field resolution. For example, an ambient magnetic field may be static or dynamic to provide magnetic field gradients in the HGA 244 that are 10 mT/nm or greater, which can map magnetic fields with less than 10 nm of surface area about the HGA 244. In other embodiments, no ambient magnetic field is present and the magnetic field gradients of the HGA 244 are greater than 10 mT/nm.

Figure 7:
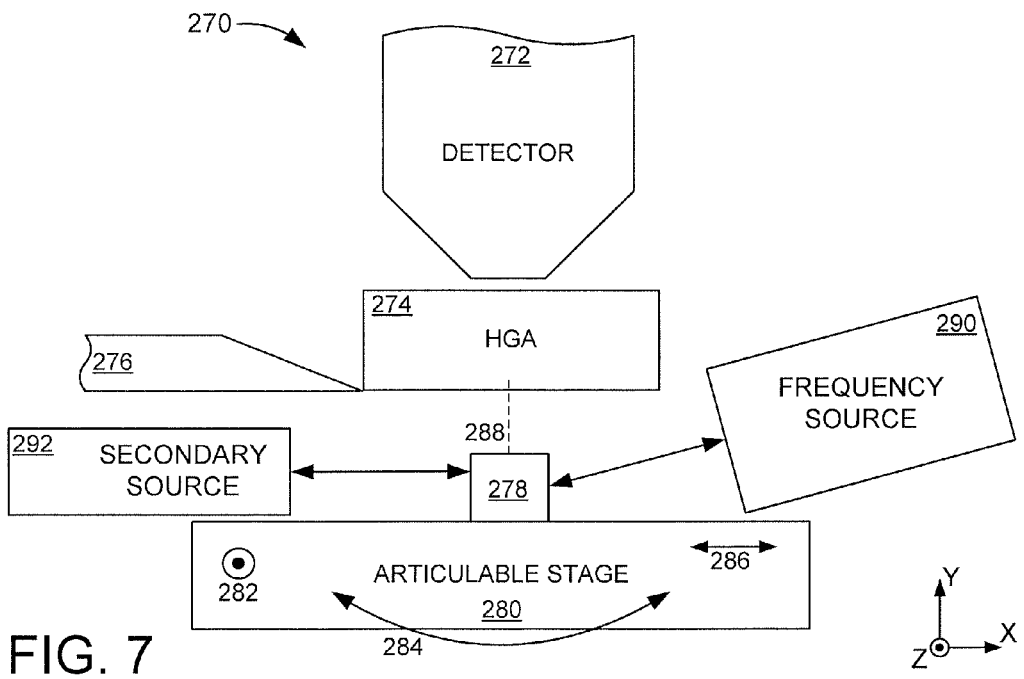
FIG. 7 displays a line representation of an example magnetic field sensor system tuned in accordance with various embodiments.

FIG. 7 displays a block representation of portions of another magnetic field sensor system 270 that can be used interchangeably with the sensor system 240 of FIG. 6. Sensor system 270 differs from system 240 by having a plurality of detectors 272 that may be arranged in a patterned or random assortment to detect magnetic fields and field gradients about a data writing portion of the HGA 274. As shown, the HGA 274 is attached to and suspended by a piezoelectric mount 276 that can induce a predetermined magnetization in the HGA 274.

Although a single nanocrystal with one or more nitrogen-vacancies can be used to detect and map magnetic fields, some embodiments configure a plurality of nanocrystals 278 in an array on an articulable stage 280. The stage 280 can be moved 282, rotated 284, and shifted 286 to align a center of the nanocrystal array with a data writing portion of the HGA 274 along a common axis 288. The ability to physically translate the articulable stage 280 can allow one or more nitrogen-vacancies of the nanocrystals 278 to be excited by first 290 and second 292 frequency sources individually and concurrently. The tuned configuration of the detectors 272, such as with different types of detectors and detectors with different sensitivities, the nanocrystals 278, and the frequency sources 290 and 292, such as redundant radio transmitters or different frequency sources, can increase sensor system 270 performance by providing sub-nanometer scale magnetic field detection about the HGA 274.

Figure 8:
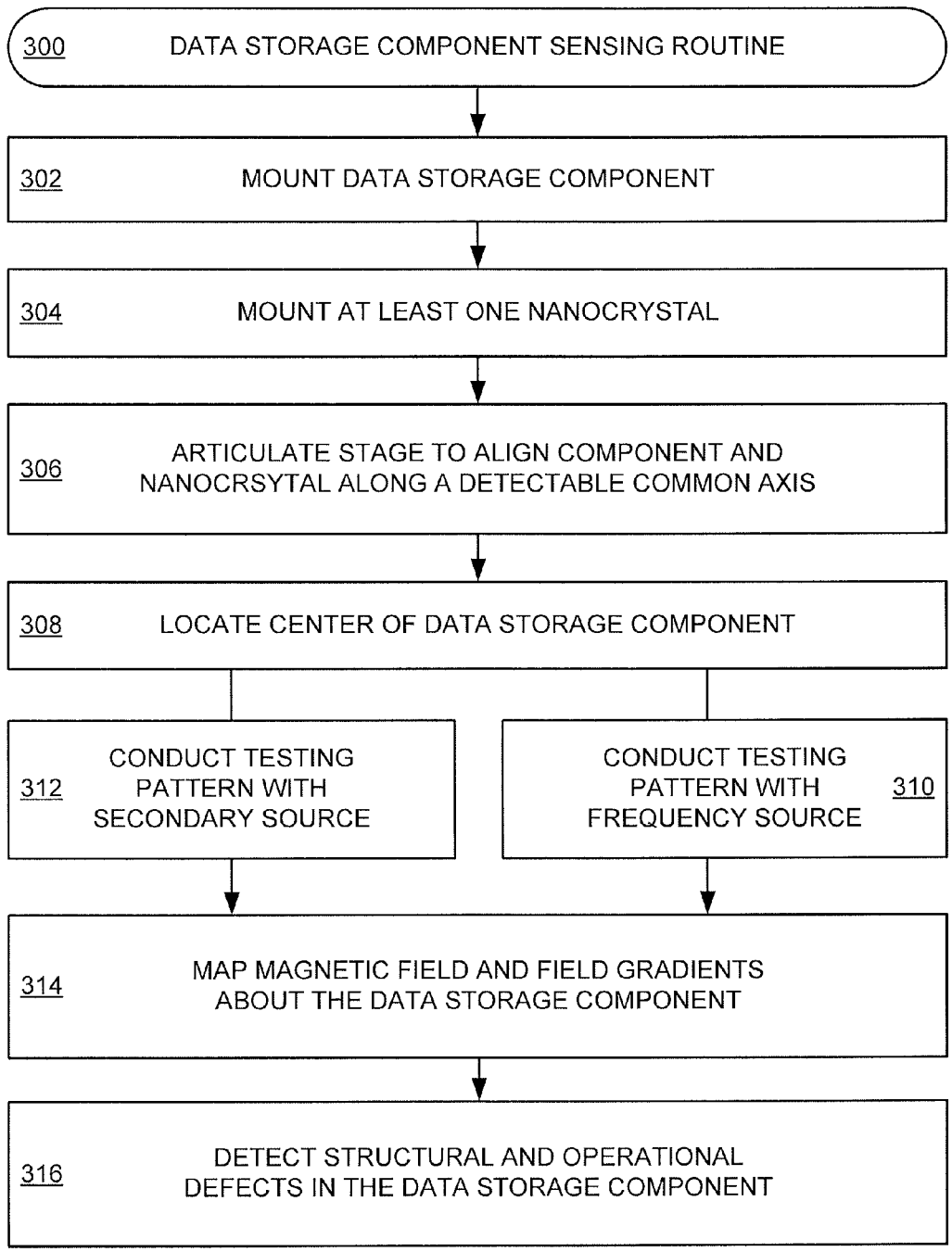
FIG. 8 illustrates an example data storage component sensing routine that may be carried out in accordance with assorted embodiments.

FIG. 8 is an example data storage component sensing routine 300 that may be carried out in accordance with various embodiments. Step 302 can initially mount a storage component, such as a data writer, and transducing head that contains both a data reader and writer. The mounting of step 302 may position the data storage component in contact with an articulable stage, like HGA 244 of FIG. 6, or in contact with a mount capable of moving through activation of the piezoelectric material by an activation signal, like HGA 274 of FIG. 7. Similar options are available in step 304 with the mounting of at least one nanocrystal onto either an articulating stage or a mount, as illustrated in FIGS. 6 and 7. Step 304 may further determine how many nanocrystals and nitrogen-vacancies are present and in what pattern, such as a non-uniform spaced array of nitrogen-vacancies.

Next, the stage is articulated in step 306 to align the data storage component, nanocrystal(s), and detector along a common axis. Such common axis may be the center of the nanocrystal, the center of a nitrogen-vacancy, and center of an array of nanocrystals as well as the center of a write pole portion of the data storage component. The alignment of the data storage component, nanocrystal, and detector can increase sensing efficiency and performance by mapping magnetic fields from portions of the data storage components that are susceptible to design and fabrication processing defects, such as a main write pole. The alignment conducted in step 306 can help find the location of a data writing center of the data storage component in step 308, which can further aid in mapping the easy axis (or quantization axis) of the nitrogen-vacancy center desired portions of the data storage component.

The alignment of sensing components and location of the data writing center of the data storage component can proceed to begin detecting magnetic fields and field gradients present about the data storage component in step 310. While detection of magnetic fields may be done statically for one or more set of testing parameters, such as data writer activation and number of frequency sources used, various embodiments conduct a testing pattern over time that varies the frequency applied to the nanocrystal, by one or more frequency sources, to map the magnetic fields present about the data storage component.

With at least one frequency source conducting a test pattern to detect magnetic fields in step 310, routine 300 may concurrently mapping magnetic fields and field gradients about the data storage component in step 312 by processing the detected alteration of the nitrogen-vacancy in the nanocrystal. In some embodiments, step 314 conducts one or more testing patterns on the nanocrystal with at least one secondary frequency source. As a non-limiting example, step 314 may utilize an optical pattern, alone or in combination with the first testing pattern of step 310, to excite the nitrogen-vacancy of the nanocrystal.

The mapping of the magnetic fields and field gradients in step 312 can allow for local and remote controllers to detect structural and operational defects in the data storage component in step 316. Such defect identification may involve comparison of sensed magnetic fields to preexisting databases or magnetic models to recognize magnetic fields that are unexpected and likely to indicate data writer defects. It should be noted that the mapping of magnetic fields cannot directly detect design, structural, and operational defects present in a data writer, but the mapping of magnetic fields with a sub-nanometer resolution can aid in identifying a deviation from expected magnetic field generation, which can subsequently be identified as a defect in design, construction, and operation.

Although the various steps of routine 300 are not required or limiting. As such, any aspect of the routine 300 can be changed, moved, and removed just as additional steps and decisions may be added, without limitation. For example, an additional step may articulate the stage after step 308 to locate and align the nanocrystal(s) to a different portion of the data storage component.

Through the use of a nanocrystal having at least one nitrogen-vacancy, a sub-nanometer scale magnetic resolution can be achieved. The ability to utilize an articulable stage can allow for the alignment nanocrystal, detector, and data storage components to ensure magnetic fields are mapped efficiently and for portions of the data storage component that are prone to magnetic field producing defects. Moreover, a nanometer scale magnetic field resolution can allow for increased innovation and quality assurance as data writing components can be experimentally tested for structural and operational defects.

It is noted that the various embodiments are not limited to magnetic field sensing of data transducing components as the technology can readily be utilized in any number of other applications, such as biomedical testing device applications. It is to be understood that even though numerous characteristics of various embodiments of the present disclosure have been set forth in the foregoing description, together with details of the structure and function of various embodiments, this detailed description is illustrative only, and changes may be made in detail, especially in matters of structure and arrangements of parts within the principles of the present technology to the full extent indicated by the broad general meaning of the terms in which the appended claims are expressed.

What is claimed is:

1. An apparatus comprising a nanocrystal comprising a nitrogen-vacancy, the nanocrystal positioned proximal a magnetic source and a mount, the mount configured to position the nanocrystal to sense magnetic fields about the magnetic source with a sub-nanometer resolution.

2. The apparatus of claim 1, wherein the mount is rigid.

3. The apparatus of claim 1, wherein the mount is flexible.

4. The apparatus of claim 1, wherein the nanocrystal comprises a carbon lattice with at least one carbon atom bound to at least one nitrogen atom.

5. The apparatus of claim 1, wherein nanocrystal has a ground spin state of 1.

6. The apparatus of claim 1, wherein the nanocrystal is suspended between a detector and the magnetic source by the mount.

7. The apparatus of claim 1, wherein first and second frequency sources are positioned on opposite sides of the nanocrystal, the frequency sources respectively emitting signals with different frequencies.

8. The apparatus of claim 7, wherein the first frequency source is positioned along a first plane in alignment with the nanocrystal and the second frequency source is positioned along a second plane in alignment with the nanocrystal, the first and second planes being different.

9. The apparatus of claim 1, wherein the mount comprises an actuator configured to move the nanocrystal relative to the magnetic source.

10. An apparatus comprising a nanocrystal comprising a nitrogen-vacancy, the nanocrystal positioned proximal a data writer and an articulable stage, the articulable stage configured to align the nanocrystal and the data writer along a common axis to sense magnetic fields about the data writer with a sub-nanometer resolution.

11. The apparatus of claim 10, wherein the data writer has an air bearing surface (ABS) surface area of less than one nanometer.

12. The apparatus of claim 10, wherein the common axis extends through a center of the nanocrystal.

13. The apparatus of claim 10, wherein the nanocrystal is separated from and disposed between the articulable stage and a plurality of detectors.

14. The apparatus of claim 10, wherein the nanocrystal contacts the articulable stage and the data writer is suspended over the nanocrystal by a mount.

15. A method comprising:
    positioning a nanocrystal proximal a data writer and an articulable stage via a mount, the nanocrystal comprising a nitrogen-vacancy; and
    sensing magnetic fields and field gradients about the data writer with sub-nanometer resolution.

16. The method of claim 15, wherein the articulable stage is moved to align the nitrogen-vacancy of the nanocrystal with the data writer along a common axis.

17. The method of claim 15, wherein the mount moves during the sensing step.

18. The method of claim 15, wherein a first source emits a radio frequency toward the nanocrystal and a second source emits an optical pattern onto the nanocrystal.

19. The method of claim 15, wherein the sensed magnetic fields and field gradients identify a defect in the data writer.

20. The method of claim 15, wherein the sensed magnetic fields and field gradients differ from a magnetic model prediction.

* * * * *